US009269780B2

(12) United States Patent
Jang

(10) Patent No.: US 9,269,780 B2
(45) Date of Patent: Feb. 23, 2016

(54) SEMICONDUCTOR DEVICE AND METHOD FOR FORMING THE SAME

(71) Applicant: SK hynix Inc., Gyeonggi-do (KR)

(72) Inventor: Kyoung Chul Jang, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 14/495,582

(22) Filed: Sep. 24, 2014

(65) Prior Publication Data
US 2015/0263111 A1    Sep. 17, 2015

(30) Foreign Application Priority Data

Mar. 13, 2014 (KR) .................... 10-2014-0029707

(51) Int. Cl.
H01L 29/66 (2006.01)
H01L 29/76 (2006.01)
H01L 29/423 (2006.01)
H01L 29/78 (2006.01)
H01L 29/10 (2006.01)
H01L 29/51 (2006.01)
H01L 21/306 (2006.01)
H01L 21/02 (2006.01)
H01L 27/108 (2006.01)

(52) U.S. Cl.
CPC ........ *H01L 29/4236* (2013.01); *H01L 21/0228* (2013.01); *H01L 21/02247* (2013.01); *H01L 21/02252* (2013.01); *H01L 21/30604* (2013.01); *H01L 27/10891* (2013.01); *H01L 29/1083* (2013.01); *H01L 29/511* (2013.01); *H01L 29/518* (2013.01); *H01L 29/66484* (2013.01); *H01L 29/7831* (2013.01)

(58) Field of Classification Search
CPC ............ H01L 29/4236; H01L 21/3105; H01L 21/28273; H01L 29/7883; H01L 29/66825; H01L 29/423

USPC .......... 257/139, 330, 133, 314, 331; 438/270, 438/585, 589, 138
See application file for complete search history.

(56) References Cited

U.S. PATENT DOCUMENTS

| | | | | |
|---|---|---|---|---|
| 6,147,377 A * | 11/2000 | Liu | | 257/314 |
| 2005/0104093 A1* | 5/2005 | Yoshimochi | | 257/224 |
| 2005/0245100 A1* | 11/2005 | Wu et al. | | 438/790 |
| 2008/0179668 A1* | 7/2008 | Tai et al. | | 257/331 |
| 2010/0144106 A1* | 6/2010 | Cho et al. | | 438/243 |
| 2012/0025299 A1* | 2/2012 | Ko | | 257/330 |

FOREIGN PATENT DOCUMENTS

KR    1020100077603    7/2010

OTHER PUBLICATIONS

English Machine Translation of Korean Patent Publication No. KR 10-20100077603.*
Wang, Z., et. al., Effect of Polysilicon Gate Type on the Flatband Voltage Shift for Ultrathin Oxide-Nitride Gate Stacks, IEEE Electron Device Letters, 2000, pp. 170-172, vol. 21, No. 4.
Wang, M. F., et. al., Ultrathin Ox/Nitride Gate Stack for Sub-Quarter-Micron CMOS Devices Prepared by RTCVD, VLSI Technology, Systems and Applications, 2001, pp. 208-211.

* cited by examiner

Primary Examiner — Long K Tran
Assistant Examiner — Dzung Tran
(74) Attorney, Agent, or Firm — IP & T Group LLP

(57) ABSTRACT

A semiconductor device includes a semiconductor substrate including a trench, a gate insulation film located over a bottom and sidewall of the trench, a first gate formed over the gate insulation film and in a lower portion of the trench, a second gate formed over the first gate and in an upper portion of the trench, a multi-layered structure provided between the gate insulation film and the second gate.

11 Claims, 11 Drawing Sheets

SEMICONDUCTOR DEVICE AND METHOD FOR FORMING THE SAME

CROSS-REFERENCE TO RELATED APPLICATION

This application claims priority of Korean patent application No. 10-2014-0029707, filed on 13 Mar. 2014, the disclosure of which is incorporated by reference in its entirety.

BACKGROUND OF THE INVENTION

Embodiments relate to a semiconductor device and a method of fabricating the same and, more particularly, to a buried word line, a semiconductor device including a buried word line, and a method for forming the semiconductor device.

As the semiconductor industry progresses, there continues to be a need to increase the integration and performance of semiconductor devices. This means the semiconductor devices that serve as the core components of the electronic appliances need to be improved. However, with increasing integration, the size of transistors in semiconductor devices must be reduced. As a result, electrical characteristics of the semiconductor devices deteriorate due to various phenomena. To address this issue, a transistor including a buried word line has recently been proposed and developed.

BRIEF SUMMARY OF THE INVENTION

Various embodiments are directed to providing a semiconductor device and a method for forming the same that address limitations and disadvantages of the related art.

Embodiments relate to a semiconductor device in which a multi-layered structure is formed in a contact region, between a gate and a junction region, so that a Gate Induced Drain Leakage (GIDL) is reduced and pause refresh characteristics are improved.

In accordance with an embodiment, A semiconductor device comprising: a semiconductor substrate including a trench; a gate insulation film located over a bottom and sidewall of the trench; a first gate formed over the gate insulation film and in a lower portion of the trench; a second gate formed over the first gate and in an upper portion of the trench; and a multi-layered structure provided between the gate insulation film and the second gate.

In accordance with another embodiment, A semiconductor device comprising: a semiconductor substrate including a trench; a gate insulation film located over a bottom and sidewall of the trench; a junction region formed in the semiconductor substrate adjacent to the trench; a gate formed over the gate insulation film and in the trench; and a multi-layered structure formed between the gate insulation film and the gate, wherein the multi-layered structure is overlapped with the junction region.

In accordance with another embodiment, a method for forming a semiconductor device includes: forming a trench by etching a semiconductor substrate; forming a gate insulation film over the trench; forming a first gate in a lower portion of the trench and over the gate insulation film; forming a multi-layered structure over a sidewall of the gate insulation film and over the first gate; forming a second gate over the multi-layered structure and over the first gate; and forming a capping layer over the multi-layered structure and over the second gate.

In accordance with another embodiment, a semiconductor device comprising: a gate; a junction; and a multi-layered structure provided between the gate and the junction, wherein the multi-layered structure is overlapped with the junction.

In accordance with another embodiment, a processor of a semiconductor device includes: a core unit configured to perform an operation corresponding to an external Input command using data; a cache memory unit configured to store at least data required for executing the operation, data corresponding to a result of the operation execution, and an address of the operation execution data; a bus interface coupled between the core unit and the cache memory, and configured to transmit data between the core unit and the cache memory; an embedded memory unit configured to store data; a communication module unit configured to transmit/receive data to/from an external device by wire or wirelessly; a memory controller configured to drive an external memory device; and a media processor configured to fabricate either data processed by a processor or data received from an external input device, and output the fabricated data to an external interface device. The embedded memory unit may include a semiconductor substrate including a trench, a gate insulation film located at the bottom and sidewall of the trench, a junction region formed over the semiconductor substrate, a gate formed over the gate insulation film in a manner such that the gate is buried in the trench, and a multi-layered structure located at an overlap region between the gate and the junction region in a specific region interposed between the gate insulation film and the gate.

In accordance with another embodiment, a system of a semiconductor device includes: a processor configured to interpret an external input command, and control an operation of information according to a result of the command interpretation; an auxiliary memory unit configured to store a program needed for the command interpretation and the information; a main memory unit configured to shift/store the program and the information from the auxiliary memory unit in such a manner that the processor performs the operation using the program and the information during execution of the program; and an interface configured to perform communication between an external part and at least one of the processor, the auxiliary memory unit, and the main memory unit. The main memory unit may include a semiconductor substrate including a trench, a gate insulation film located at the bottom and sidewall of the trench, a junction region formed over the semiconductor substrate, a gate formed over the gate insulation film in a manner such that the gate is buried in the trench, and a multi-layered structure located at an overlap region between the gate and the junction region in a specific region interposed between the gate insulation film and the gate.

In accordance with another embodiment, a data storage system of a semiconductor device includes: a storage unit configured to store data, and maintain the stored data irrespective of the presence or absence of a power source; a controller configured to control data input/output (I/O) of the storage unit in response to an external input command; a temporary storage unit configured to temporarily store data exchanged between the storage unit and an external part; and an interface configured to perform communication between an external part and at least one of the storage unit, the controller, and the temporary storage unit. The temporary storage unit may include a semiconductor substrate including a trench, a gate insulation film located at the bottom and sidewall of the trench, a junction region formed over the semiconductor substrate, a gate formed over the gate insulation film in a manner such that the gate is buried in the trench, and a multi-layered structure located at an overlap region between the gate and the junction region in a specific region interposed between the gate insulation film and the gate.

In accordance with another embodiment, a memory system of a semiconductor device includes: a memory configured to store data, and maintain the stored data irrespective of the presence or absence of a power source; a memory controller configured to control data input/output (I/O) of the storage unit in response to an external input command; a buffer memory configured to perform buffering of data exchanged between the storage unit and an external part; and an interface configured to perform communication between an external part and at least one of the storage unit, the memory controller, and the buffer memory. The buffer memory may include a semiconductor substrate including a trench, a gate insulation film located at the bottom and sidewall of the trench, a junction region formed over the semiconductor substrate, a gate formed over the gate insulation film in such a manner that the gate is buried in the trench, and a multi-layered structure located at an overlap region between the gate and the junction region in a specific region interposed between the gate insulation film and the gate.

It is to be understood that the embodiments are exemplary and explanatory and are not intended to restrict the inventive concept.

DESCRIPTION OF EMBODIMENTS

Embodiments are illustrated in reference to the accompanying drawings. Wherever possible, the same reference numbers are used throughout the drawings to refer to the same or like components or portions.

FIGS. 1A to 1G are cross-sectional views illustrating a semiconductor device including a buried word line and a method for fabricating the same according to an embodiment.

Figure 1A:
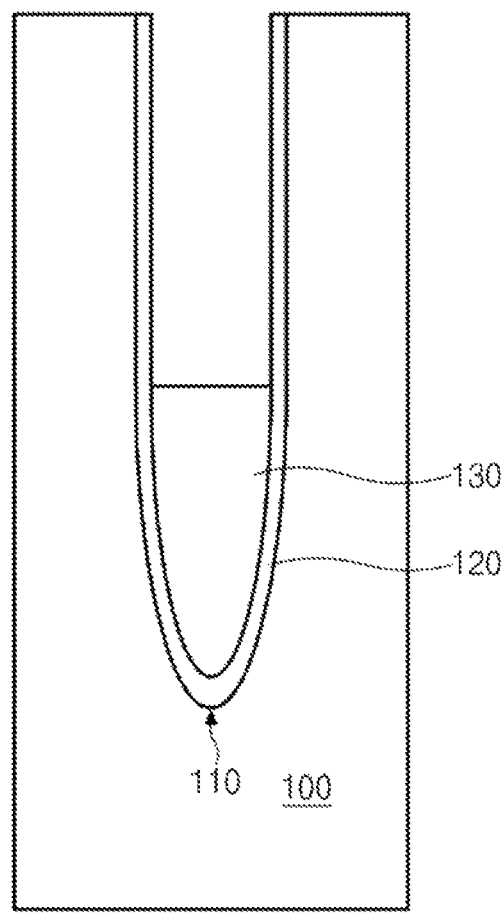
FIGS. 1A to 1G are cross-sectional views illustrating a semiconductor device including a buried word line and a method for fabricating the same according to an embodiment.

Referring to FIG. 1A, after a mask pattern (not shown) for defining a buried gate in a semiconductor substrate 100 is formed, the semiconductor substrate 100 is etched using the mask pattern as an etch mask, resulting in formation of a trench 110.

Subsequently, a gate insulation film 120 is formed in the trench 110. For example, the gate insulation film 120 may be formed by performing an oxidation process to the semiconductor substrate 100 or by depositing an oxide film over the semiconductor substrate 100. The gate insulation film 120 may be formed in a liner pattern along a contour of the trench 110.

After a gate metal layer is filled in the trench 110, the gate metal layer is etched back, resulting in formation of a first gate electrode 130. The gate metal layer may include titanium (Ti), titanium nitride (TiN), a stack of titanium/titanium nitride (Ti/TIN), tungsten (W), tungsten nitride (WN), a stack of tungsten/tungsten nitride (W/WN), tantalum (Ta), tantalum nitride (TaN), a stack of tantalum/tantalum nitride (Ta/TaN), titanium silicon nitride (TiSIN), tantalum nitride silicon (TaSIN), tungsten silicon nitride (WSIN), or a combination thereof. The first gate electrode 130 is etched back so that the first gate electrode 130 is recessed at a lower portion of the trench 110. As a result, the gate insulation film 120 is exposed at an upper portion of the trench 110 and over the first gate electrode 130.

Figure 1B:
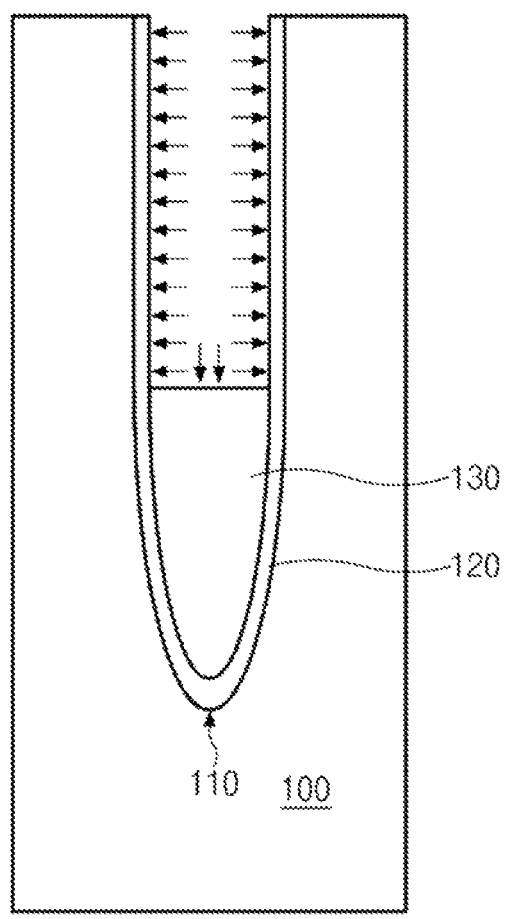

Referring to FIG. 1B, a plasma nitridation process is performed over the gate insulation film 120 exposed over the first gate electrode 130. A nitrogen is induced in the upper portion of the gate insulation film 120 by the plasma nitridation process. The plasma nitridation process may be performed using a Rapid Thermal Process (RTP) under ammonia ($NH_3$). The gate insulation film 120 is subject to a thermal annealing process in an RTP. In another embodiment, the plasma nitridation process is performed by placing the substrate 100, including the gate insulation film 120, in a furnace under a gas atmosphere including $N_2$, NO, $N_2O$ or a combination thereof. In addition, the plasma nitridation process may also be achieved by a remote plasma nitridation process.

Figure 1C:
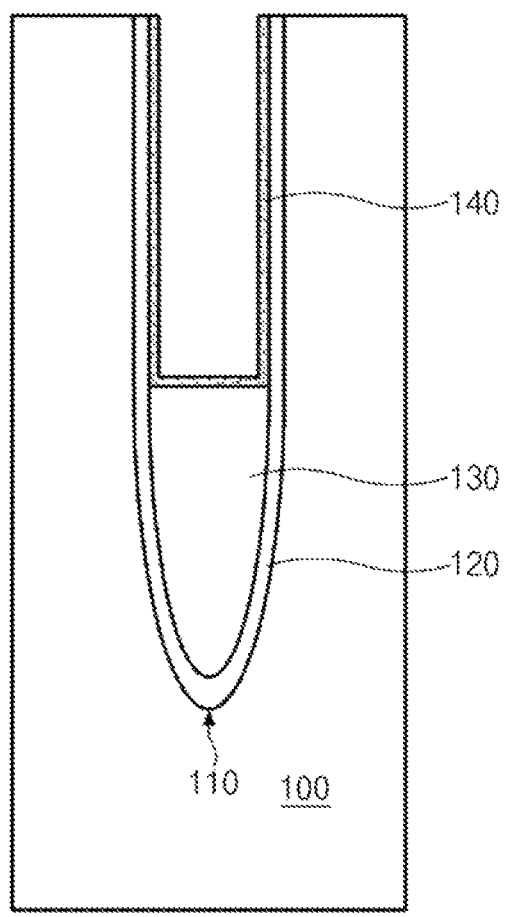
Figure 1D:
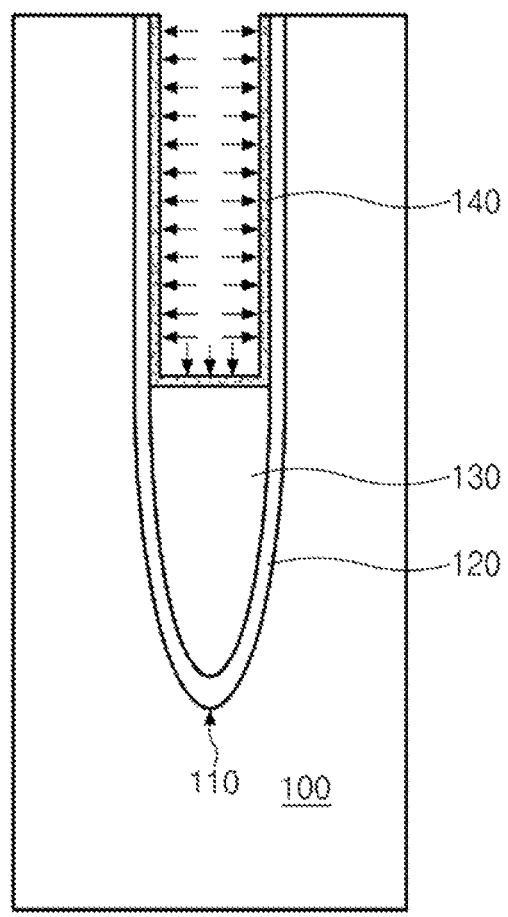

Referring to FIGS. 1C and 1D, a nitride film 140 is formed over the first gate electrode 130 recessed in the trench 110 and over the exposed gate insulation film 120 including the nitrogen. The nitride film 140 may be formed by using a nitridation process or by depositing a nitride film.

This process for depositing a nitride film may be performed by an atomic layer deposition (ALD) process. A thin film configured to use the ALD method and apparatus can more precisely adjust a thickness on an atom basis and minimize the amount of impurities of a deposited thin film, such that the thin film has superior insulation characteristics.

Thereafter, a plasma nitridation process may be additionally performed on the nitride film 140. The nitride film 140 may be formed by a process for implanting impurities such as nitrogen. As a result, the nitride film 140a includes positively charged impurities, e.g., holes. That is, the positively charged impurities may be present at the interface between the gate insulation film 120 and the nitride film 140. The impurities implanted are not limited to nitrogen. When the impurity implanted is boron, the nitride film 140 may include negative charges such as electrons.

In addition, impurities such as nitrogen (N) may be implanted into the gate insulation film 120, such that positive fixed charges may occur an interface between gate insulation film 120 and the nitride film 140. The nitride film 140 may include a nitrogen-excessive nitride film 140. In another embodiment, the first charged nitride film 120c may be any insulation film containing positively charged holes or negatively charged electrons. If the impurity implantation process is performed, impurity dose, type, energy, and angle as well as the threshold voltage can be easily adjusted in various ways. In addition, the amount of positive charge may vary depending on the profile of negatively charged impurities present at the interface of the gate insulation film 120 and the nitride film 140. The positive charges may be offset by negative charges present in the gate insulation film 120, minimizing variation in the flat band voltage (hereinafter referred to as Vfb). When the impurities present in the gate insulation film 120 or at the interface between the gate insulation film 120 and the nitride 140 are positively charged. In addition, a large amount of positive charges are present in the insulation film 120, and GIDL between the first gate electrode 130 and a junction region (180, 190 in FIG. 1g) is reduced and threshold voltage between the junction region and the first gate electrode 130 can be maintained at a predetermined level. Thus, defective Write Recovery Time (tWR) phenomena can be minimized.

Figure 1E:
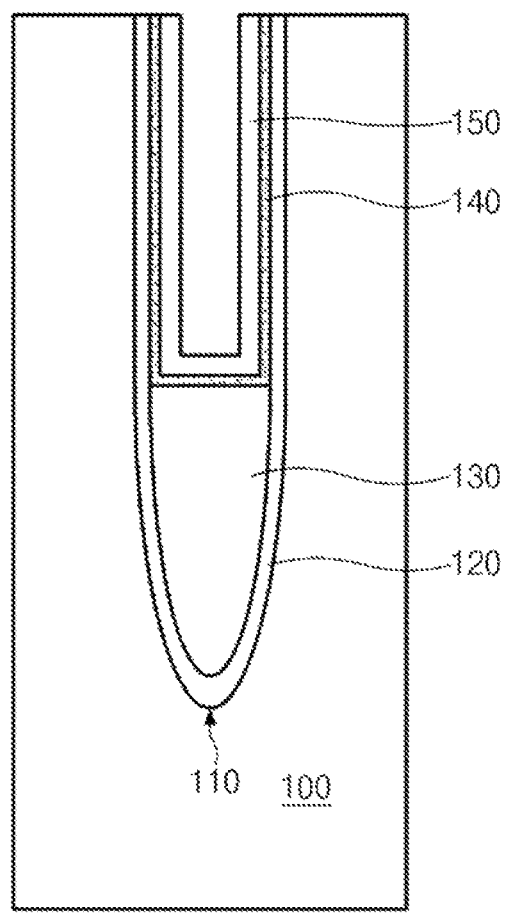

Referring to FIG. 1E, an insulation film 150 is formed over the nitride film 140. The insulation film 150 may include an oxide film.

Figure 1F:
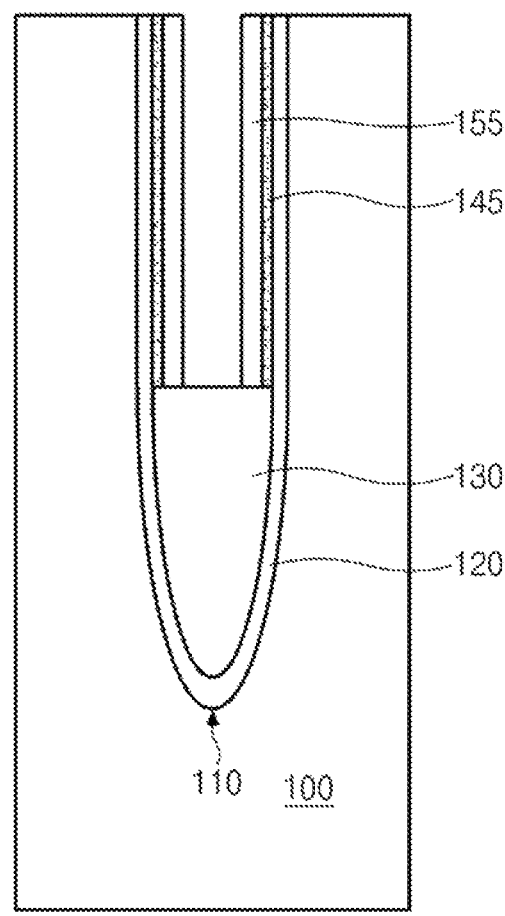

Referring to FIG. 1F, the insulation film 150 and the nitride film 140, including the fixed charge, are etched back until the first gate electrode 130 is exposed. That is, the insulation film 150 and the nitride film 140 (including the fixed charge), both of which are formed over the first gate electrode 130, are removed. As a result, an insulation film pattern 155 and a nitride film pattern 145 (including the fixed charge) are formed over an upper sidewall of the trench 110.

Figure 1G:
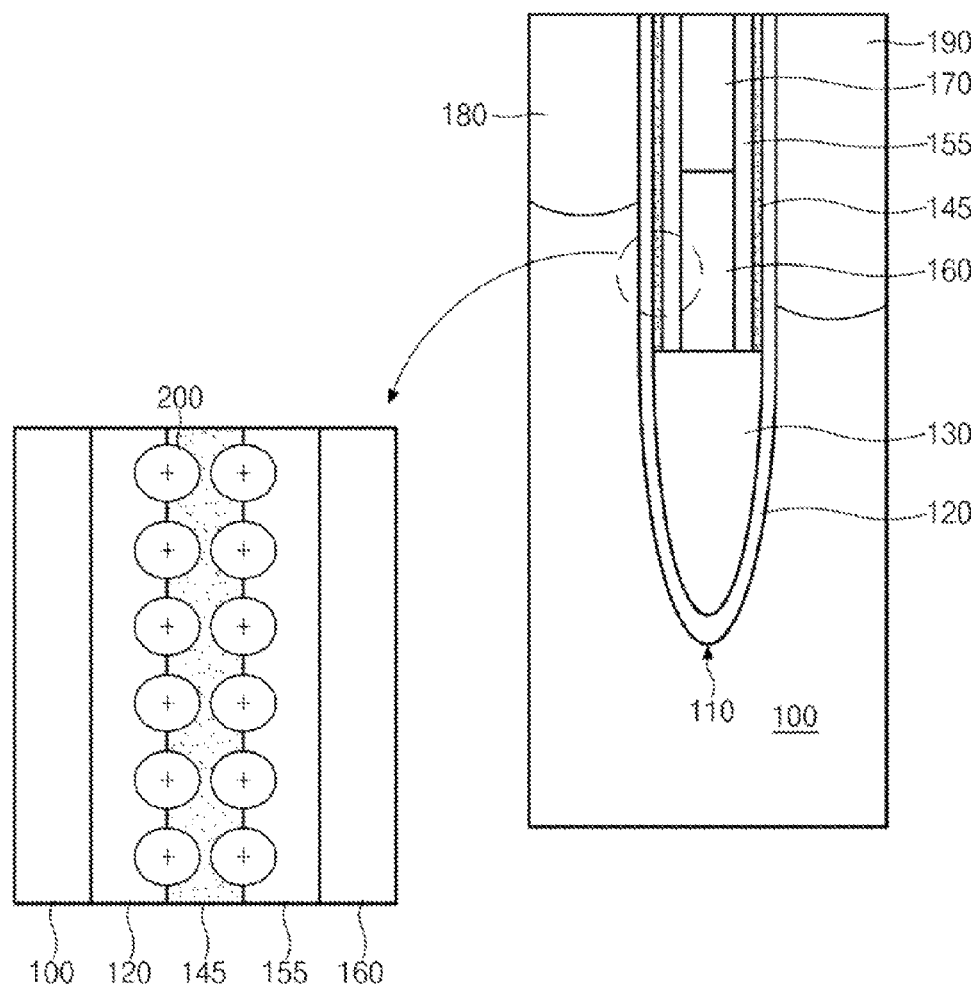

Referring to FIG. 1G, a gate metal layer is deposited over the exposed first gate electrode 130. The gate metal layer is etched back, resulting in formation of a second gate electrode 160. In this case, the gate metal layer may include titanium (Ti), titanium nitride (TIN), a stack of titanium/titanium nitride (Ti/TiN), tungsten nitride (WN), a stack of tungsten/tungsten nitride (W/WN), tantalum (Ta), tantalum nitride (TaN), a stack of tantalum/tantalum nitride (Ta/TaN), titanium silicon nitride (TiSiN), tantalum nitride silicon (TaSiN), tungsten silicon nitride (WSiN), or a combination thereof.

As a result, a buried gate including a stack of the second gate electrode 160 and the first gate electrode 130 is completed. In other words, the buried gate may have a bi-layer or multi-layer structure including the first gate electrode 130 and the second gate electrode 160. The second gate electrode 160 has a smaller width than the first gate electrode 130. The second gate electrode 160 may or may not be recessed in the trench.

The first gate electrode 130 may serve to stably maintain the work function configured to control the cell threshold voltage (Cell Vt). That is, the first gate electrode 130 serves to drive a transistor. The second gate electrode 160 may serve to reduce resistance of the buried gate. With such a structure, the ability to drive a transistor is improved and resistance of the buried gate is reduced. Thus, the operating speed of the semiconductor device including the buried gate can be improved.

Subsequently, a capping layer 170 is formed in an upper part of the second gate electrode 160. The capping layer 170 may include an oxide film having superior gap-filling characteristics. For example, the capping layer 170 may include a Spin On Dielectric (SOD) film including a polysilazane (PSZ) material.

Thereafter, impurities are implanted into the semiconductor substrate 100 adjacent to the buried gate (160, 170) such that junction regions (180, 190) are formed. In this case, the junction regions (180, 190) may be also referred to as source/drain regions.

Referring to the buried gate structure of FIG. 1g, an oxide-nitride-oxide (ONO) structure is obtained by a stack of the gate insulation film 120, the nitride film pattern 145, and the insulation film pattern 155. The oxide-nitride-oxide (ONO) structure is formed between the second gate electrode 160 and the junction regions (180, 190).

A plurality of positive charges 200 may be present at an interface between the gate insulation film 120 and the nitride film pattern 145. In addition, a plurality of positive charges 200 may be further present at an interface between the nitride film pattern 145 and the insulation film pattern 155. Thus, GIDL between the buried gate and the junction regions (180, 190) can be suppressed. Accordingly, GIDL between the buried gate and either a storage node contact plug or bit line contact plug, to be formed in a subsequent process, can also be suppressed.

The above-mentioned ONO structure can improve pause characteristics of a dynamic random access memory (DRAM) device. The ONO structure may be a multi-layered structure. The multi-layered structure may be formed by alternately depositing a plurality of nitride films and a plurality of oxide films. The positively charged nitride film may be interposed between the multi-layered structures. That is, two or three times as many positive charges 200 may occur in the ONO structure. Thus, GIDL between the buried gate and other constituent elements can be reduced.

Figure 2:
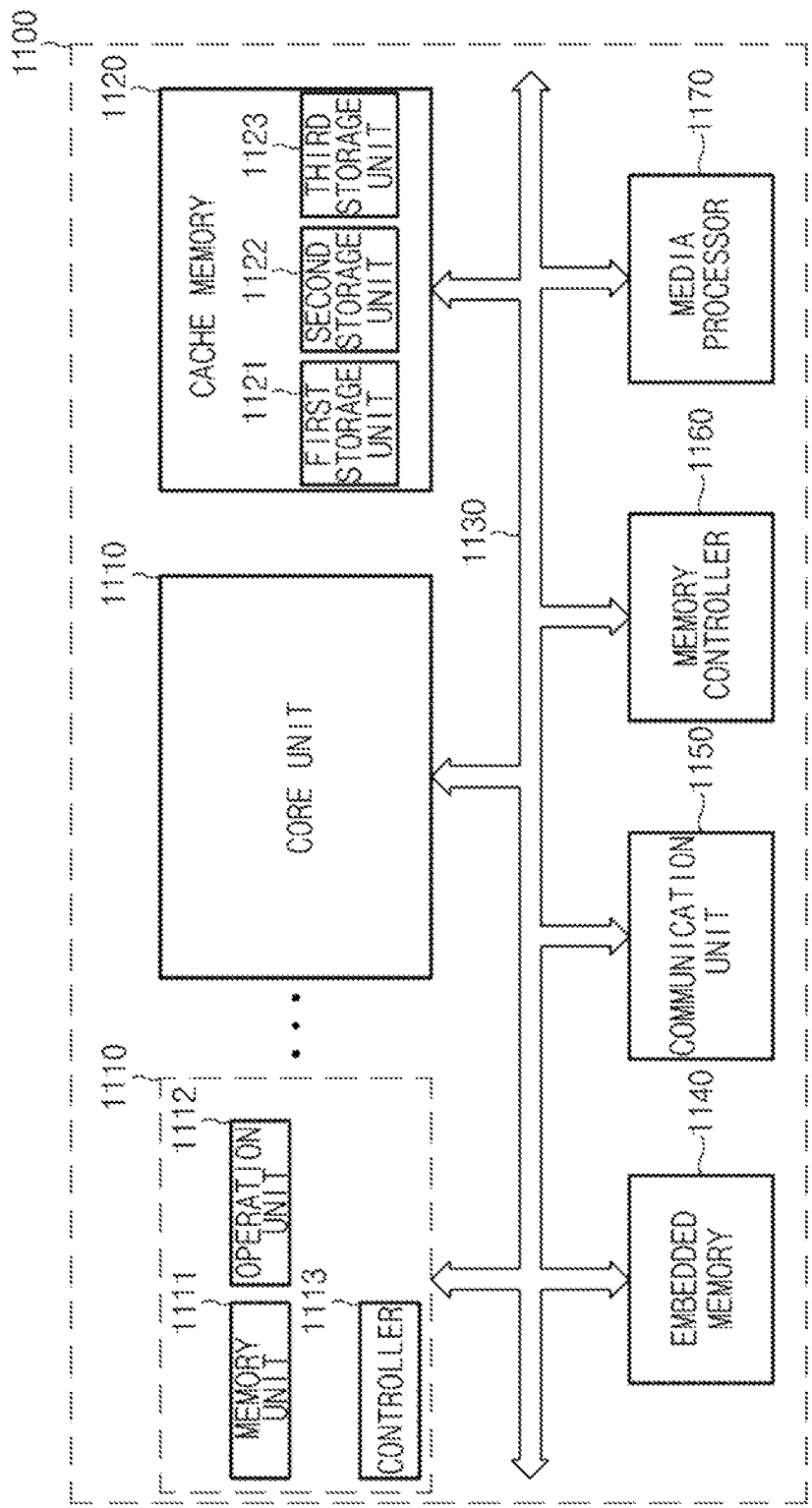
FIG. 2 is a block diagram illustrating a processor according to an embodiment.

FIG. 2 is a block diagram illustrating a processor 1100 according to an embodiment.

Referring to FIG. 2, the processor 1100 may include a microprocessor configured to control and adjust a series of operations for receiving data from various external devices and outputting the processed result to the external devices, and may include a variety of functions, such that throughput improvement and multi-functional characteristics can be implemented. In addition, the processor 1100 may include a core unit 1110, a cache memory unit 1120, and a bus interface 1130. The core unit 1110 according to this embodiment is used as an arithmetic/logic operator of data received from an external device, and may include a memory unit 1111, an operation unit 1112, and a controller 1113. The processor 1110 may be a variety of system on chips (SoCs) such as a Multi Core Processor (MCU), a Graphic Processing Unit (GPU), an Application Processor (AP), etc.

The memory unit 1111 serving as a processor register or a register is contained in the processor 1110 to store data and may include a data register, an address register, a floating-point register, and a variety of other registers. The memory unit 1111 may temporarily store either data requisite for calculation of the operation unit 1112 or execution resultant data, and may store an address in which data for execution is stored. The operation unit 1112 is configured to perform internal operations of the processor 1100, and performs various four fundamental arithmetic operations or logic operations according to the result obtained by command interpretation of the controller 1113. The operation unit 1112 may include one or more Arithmetic and Logic Units (ALUs). The controller 1113 may receive signals from the memory unit 11111, the operation unit 1112, the processor 1110, and other external devices, and may perform various control operations such as command extraction, command analysis, and command input/output, etc. such that processes written in the programming can be carried out.

Unlike the core unit 1110 operating at high speed, the cache memory unit 1120 may temporarily store data to compensate for the low data processing speeds of external devices, and may include a first storage unit 1121, a second storage unit 1122, and a third storage unit 1123. Generally, the cache memory unit 1120 includes a first storage unit 1121 and a second storage unit 1122. If the cache memory unit 1120 needs to have high capacity, it may further include the third storage unit 1123. If necessary, the cache memory unit 1120 may have more storage units. That is, the number of storage units contained in the cache memory unit 1120 may be different according to a variety of designs. In this case, the first, second, and third storage units (1121, 1122, 1123) may have the same or different data storage and distinct processing speeds. If the first to third storage units (1121, 1122, 1123) have different processing speeds, the first storage unit 1121 may have the highest speed. At least one of the first storage unit 1121, the second storage unit 1122, and the third storage unit 1123 of the cache memory unit 1120 may include at least one of the embodiments of the above-mentioned semiconductor device.

Although the first, second, and third storage units (1121, 1122, 1123) are configured in the cache memory unit 1120 as shown in FIG. 8, the first to third storage units (1121, 1122, 1123) of the cache memory unit 1120 may be located outside of the core unit 1110, and it is possible to compensate for a difference in processing speed between the core unit 1110 and the external device. In addition, the first storage unit 1121 of the cache memory unit 1120 may be located inside of the core unit 1110, and the second and third storage units (1122, 1123) may be located outside of the core unit 1110, such that the function for compensating for the processing speed can be emphasized.

A bus interface 1130 couples the core unit 1110 to the cache memory unit 1120, such that data can be more efficiently transmitted through the bus interface 1130.

The processor 1110 according to the embodiment may include a plurality of core units 1110, and a plurality of core units 1110 may share the cache memory unit 1120. The core units 1110 may be coupled to the cache memory unit 1120 through the bus interface 1430. The plurality of core units may be identical in structure to the above-mentioned core units. If the processor 1100 includes the core units 1110, the first storage unit 1121 of the cache memory unit 1120 may be configured in each core unit 1110 in correspondence to the number of core units 1110, the second storage unit 1122 and the third storage unit 1123 may be integrated into one storage unit, and the integrated storage unit may be located outside of the plurality of core units 1110 and be shared by an external bus interface 1430. The processing speed of the first storage unit 1121 may be higher than that of the second or third storage unit 1122 or 1123.

The processor 1100 according to the embodiment may further include an embedded memory 1140 for storing data; a communication module 1150 for transmitting/receiving data to/from an external device by wire or wirelessly; a memory controller 1160 for driving an external memory device; and a media processor 1170 for processing either data processed by the processor 1100 or input data received from the external input device, and outputting the processed data to the external interface device. Besides the above constituent elements, the processor 1100 may further include a plurality of modules. In this case, the added modules may transmit/receive data to/from the core unit 1110 and the cache memory 1120 through the bus interface 1130. The embedded memory 1140 may include a semiconductor substrate including a trench, a gate insulation film located at the bottom and sidewall of the trench, a junction region formed over the semiconductor substrate, a gate formed over the gate insulation film in such a manner that the gate is buried in the trench, and a multilayered structure located between the gate and the junction region.

As described above, since the multi-layered structure is formed between a gate and a junction region, positive charges are present in the multi-layered structure so that GIDL is mitigated and pause refresh characteristics are improved, resulting in improvement of semiconductor device characteristics. As a result, the operation characteristics of the embedded memory 1140 can be improved, resulting in the implementation of a high-performance processor 1100.

The embedded memory 1140 may include a non-volatile memory and a volatile memory. The volatile memory may include a Dynamic Random Access Memory (DRAM), a Mobile DRAM, a Static Random Access Memory (SRAM), etc. The non-volatile memory may include a Read Only Memory (ROM), a Nor Flash Memory, a NAND Flash Memory, a Phase Change Random Access Memory (PRAM), a Resistive Random Access Memory (RRAM), a Spin Transfer Torque Random Access Memory (STTRAM), a Magnetic Random Access Memory (MRAM), etc.

The communication module 1150 may include a module coupled to a wired network and a module coupled to a wireless network. The wired network module may include a Local Area Network (LAN), a Universal Serial Bus (USB), an Ethernet, a Power Line Communication (PLC), etc. The wireless network module may include Infrared Data Association (IrDA), Code Division Multiple Access (CDMA), Time Division Multiple Access (TDMA), Frequency Division Multiple Access (FDMA), Wireless LAN (WLAN), Zigbee, Ubiquitous Sensor Network (USN), Bluetooth, Radio Frequency Identification (RFID), Long Term Evolution (LTE), Near Field Communication (NFC), Wireless Broadband Internet (Wibro), High Speed Downlink Packet Access (HSDPA), Wideband CDMA (WCDMA), Ultra WideBand (UWB), etc.

The memory controller 1160 may manage transmission data between the processor 1100 and external storage devices operated according to different communication standards, and may include a variety of memory controllers and a controller. The controller may control Integrated Device Electronics (IDE), Serial Advanced Technology Attachment (SATA), Small Computer System Interface (SCSI), Redundant Array of Independent Disks (RAID), Solid State Disc (SSD), External SATA (eSATA), Personal Computer Memory Card International Association (PCMCIA), Universal Serial Bus (USB), Secure Digital (SD), mini Secure Digital card (mSD), micro SD, Secure Digital High Capacity (SDHC), Memory Stick Card, Smart Media Card (SM), Multi Media Card (MMC), Embedded MMC (eMMC), Compact Flash (CF), etc.

The media processor 1170 may include a Graphics Processing Unit (GPU), a Digital Signal Processor (DSP), a High Definition Audio (HD Audio), a High Definition Multimedia Interface (HDMI) controller, etc., which are configured to fabricate data processed by the processor 1100 and input data received from an external input device in the form of audio, video, and other data and transferred to the external interface device.

Figure 3:
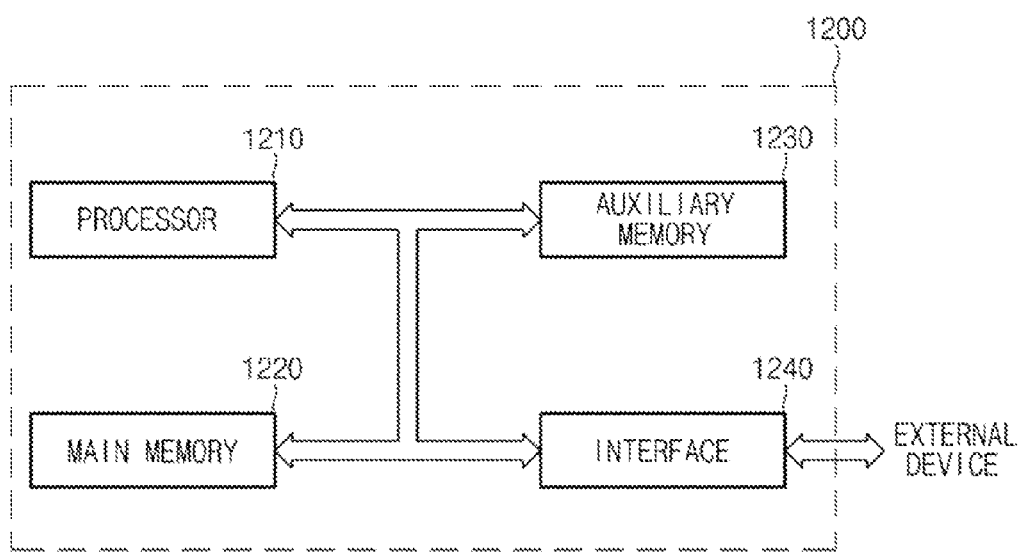
FIG. 3 is a block diagram illustrating a system according to an embodiment.

FIG. 3 is a block diagram Illustrating a system 1200 according to an embodiment.

Referring to FIG. 3, the system 1200 serving as a data processor may perform a variety of operations such as input, processing, output, communication, and storing actions, and may include a processor 1210, a main memory unit 1220, an auxiliary memory unit 1230, and an interface unit 1240. The system according to the embodiment may be any one of a variety of electronic systems operated by a variety of processes, for example, a computer, a server, a Personal Digital Assistant (PDA), a Portable Computer, a Web Tablet, a Wireless Phone, a mobile phone, a smart phone, a digital music player, Portable Multimedia Player (PMP), a camera, a Global Positioning System (GPS), a video camera, a voice recorder, a Telematics, an Audio Visual (AV) System, a Smart Television, etc.

The processor 1210 is the most important element for interpreting an input command and controlling various processes such as calculation, comparison, etc. of data stored in the system. For example, the processor 1210 may be comprised of a Micro Processor Unit (MPU), a Central Processing Unit (CPU), a Single/Multi Core Processor, a Graphic Processing Unit (GPU), an Application Processor (AP), a Digital Signal Processor (DSP), etc.

The main memory unit 1220 is a memory for shifting a program or data stored in the auxiliary memory unit 1230 during the program execution time and may include the semiconductor device according to the above-mentioned embodiment. The main memory unit 1220 may include a semiconductor substrate including a trench, a gate insulation film located at the bottom and sidewall of the trench, a junction region formed over the semiconductor substrate, a gate formed over the gate insulation film in a manner such that the gate is buried in the trench, and a multi-layered structure located at an overlap region between the gate and the junction region in a specific region interposed between the gate insulation film and the gate.

As described above, since the multi-layered structure is formed between a gate and a junction region, positive charges are present in the multi-layered structure. Thus, GIDL is mitigated and pause refresh characteristics are improved, resulting in improvement of semiconductor device characteristics. As a result, the operation characteristics of the system 1200 including the main memory unit 1220 can be improved, resulting in the implementation of a high-performance system 1200.

In addition, the main memory unit 1220 may include a Static Random Access Memory (SRAM) and a Dynamic Random Access Memory (DRAM), etc. Data stored in a volatile memory is lost when the main memory unit 1220 is powered off.

The auxiliary memory unit 1230 is a memory device for storing a program code or data. The auxiliary memory unit 1230 may store a large amount of information or data whereas it operates at a lower speed than the main memory unit 1220. The auxiliary memory unit 1230 may further include data storage systems, for example, a magnetic tape using a magnetic field, a magnetic disc, a laser disc using light, a magneto-optical disc using the magnetic disc and the laser disc, a Solid State Disc (SSD), a Universal Serial Bus (USB) memory, a Secure Digital (SD), a mini Secure Digital (mSD) card, a micro SD, a high-capacity Secure Digital High Capacity (SDHC), a memory stick card (MSC), a Smart Media (SM) card, a Multi Media Card (MMC), an Embedded MMC (eMMC), a Compact Flash (CF) card, etc.

The interface unit 1240 may be configured to exchange command and data between the system of this embodiment and an external device, and may be any of a keypad, a keyboard, a mouse, a speaker, a microphone, a display, a variety of Human Interface Devices (HIDs), a communication device, etc. The communication device may include a module coupled to a wired network and a module coupled to a wireless network. The wired network module may include a Local Area Network (LAN), a Universal Serial Bus (USB), an Ethernet, a Power Line Communication (PLC), etc. The wireless network module may include an Infrared Data Association (IrDA), a Code Division Multiple Access (CDMA), a Time Division Multiple Access (TDMA), a Frequency Division Multiple Access (FDMA), a Wireless LAN, a Zigbee, a Ubiquitous Sensor Network (USN), a Bluetooth, a Radio Frequency Identification (RFID), a Long Term Evolution (LTE), a Near Field Communication (NFC), a Wireless Broadband Internet (Wibro), a High Speed Downlink Packet Access (HSDPA), a Wideband CDMA (WCDMA), a Ultra WideBand (UWB), etc.

Figure 4:
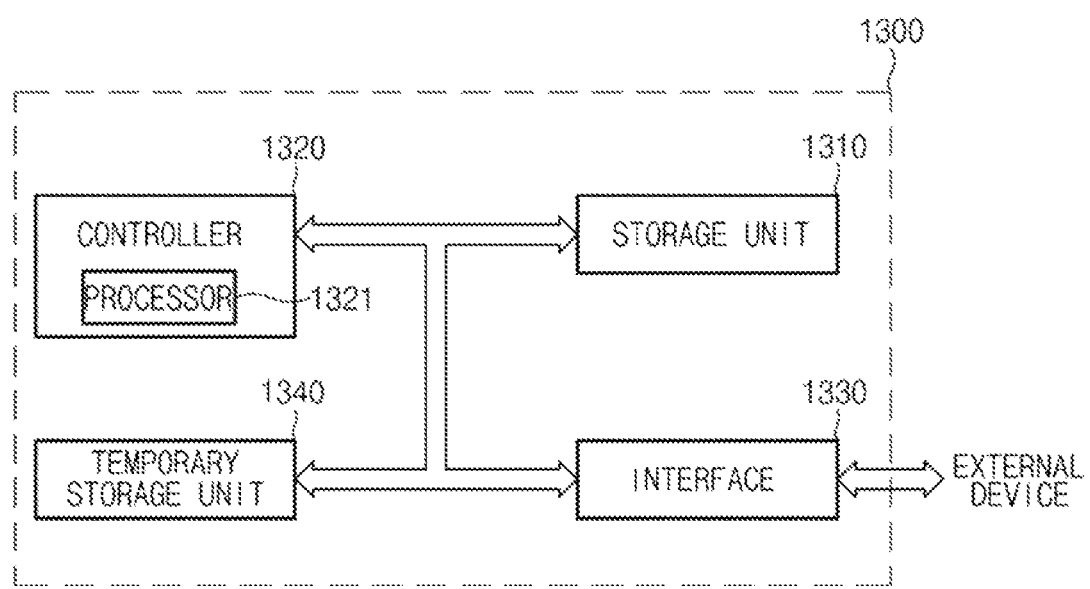
FIG. 4 is a block diagram illustrating a data storage system according to an embodiment.

FIG. 4 is a block diagram illustrating a data storage system 1300 according to an embodiment.

Referring to FIG. 4, the data storage system 1300 may include a non-volatile storage unit 1310 for storing data, a controller 1320 for controlling the non-volatile storage unit 1310, and an interface 1330 coupled to an external device. The data storage system 1300 may be configured in the form of a disc, for example, a Hard Disk Drive (HDD), a Compact Disc Read Only Memory (CDROM), a Digital Versatile Disc (DVD), a Solid State Disc (SSD), and may also be configured in the form of a card, for example, a Universal Serial Bus (USB) memory, a Secure Digital (SD) card, a mini Secure Digital (mSD) card, a micro SD card, a high-capacity Secure Digital High Capacity (SDHC), a Memory Stick Card, a Smart Media (SM) card, a Multi Media Card (MMC), an Embedded MMC (eMMC), a Compact Flash (CF) card, etc.

The controller 1320 may control data exchange between the storage unit 1310 and the interface 1330. For this purpose, the controller 1320 may include a processor configured to calculate/process commands received through the interface 1330 from an external part of the data storage system 1300.

The interface 1330 may exchange commands and data between the data storage system 1300 and the external device. If the data storage system 1300 is configured in the form of a card, the data storage system 1300 may be used as an interface that is compatible with a Universal Serial Bus (USB) memory, a Secure Digital (SD) card, a mini Secure Digital (mSD) card, a micro SD card, a high-capacity Secure Digital High Capacity (SDHC), a memory stick card, a Smart Media (SM) card, a Multi Media Card (MMC), an Embedded MMC (eMMC), and a Compact Flash (CF) card. If the data storage system 1300 is configured in the form of a disc, the data storage system 1300 may be used as an interface that is compatible with an Integrated Device Electronics (IDE), a Serial Advanced Technology Attachment (SATA), a Small Computer System Interface (SCSI), External SATA (eSATA), a Personal Computer Memory Card International Association (PCMCIA), and a Universal Serial Bus (USB).

The data storage system 1300 according to an embodiment may further include a temporary storage unit 1340 configured to efficiently perform data communication between the interface 1330 and the storage unit 1310. The temporary storage unit 1340 may include the above-mentioned semiconductor device. The storage unit 1310 may include a semiconductor substrate including a trench, a gate insulation film located at the bottom and sidewall of the trench, a junction region formed over the semiconductor substrate, a gate formed over the gate insulation film in a manner such that the gate is buried in the trench, and a multi-layered structure located between the gate and the junction region.

As described above, since the multi-layered structure is formed between a gate and a junction region, positive charges are present in the multi-layered structure so that GIDL is mitigated and pause refresh characteristics are improved, resulting in improvement of semiconductor device characteristics. As a result, the operation characteristics of the data storage system 1300 including the temporary storage unit 1340 can be improved, resulting in the implementation of a high-performance data storage system 1300.

Figure 5:
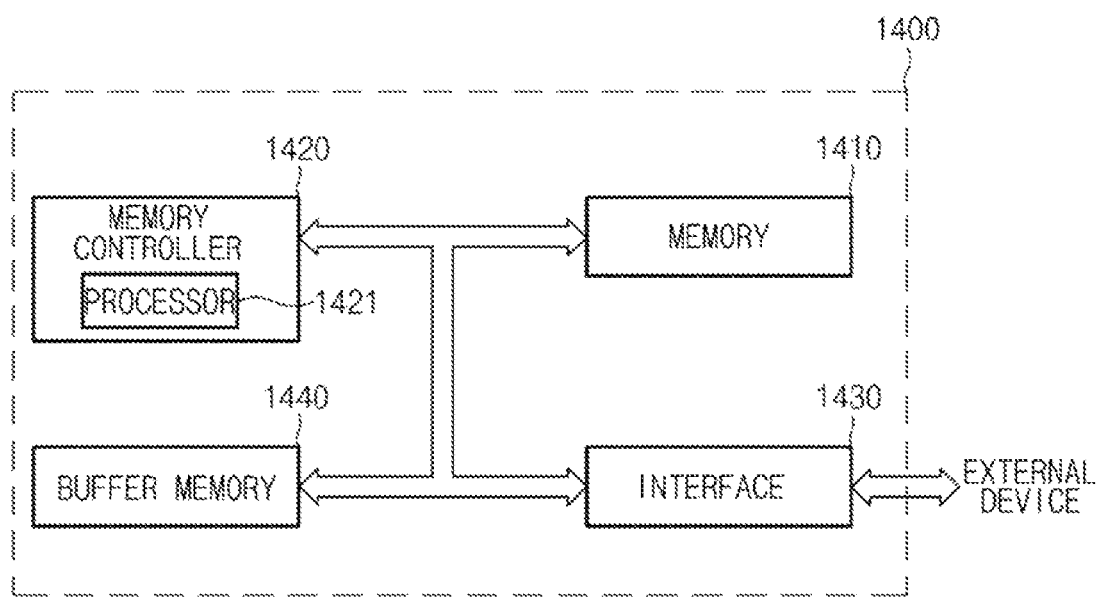
FIG. 5 is a block diagram illustrating a memory system according to an embodiment.

FIG. 5 is a block diagram illustrating a memory system 1400 according to an embodiment.

Referring to FIG. 5, the memory system 1400 may include a non-volatile memory 1410 for storing data, a memory controller 1420 for controlling the non-volatile memory 1410, and an interface 1430 coupled to the external device. The memory system 1400 may be configured in the form of a card, for example, a Solid State Disc (SSD), a Universal Serial Bus (USB) memory, a Secure Digital (SD) card, a mini Secure Digital (mSD) card, a micro SD card, a Secure Digital High Capacity (SDHC), a memory stick card, a Smart Media (SM) card, a Multi Media Card (MMC), an embedded MMC (eMMC), a Compact Flash (CF) card, etc.

In addition, the memory according to the embodiment may further include a non-volatile memory, for example, a Read Only Memory (ROM), a Nor Flash Memory, a NAND Flash Memory, a Phase Change Random Access Memory (PRAM), a Resistive Random Access Memory (RRAM), a Magnetic Random Access Memory (MRAM), etc.

The memory controller 1420 may control data communication between the memory 1410 and the interface 1430. For this purpose, the memory controller 1420 may include a processor configured to calculate/process commands received through the interface 1430 from an external part of the memory system 1400.

The interface 1430 may exchange commands and data between the memory system 1400 and the external device, and may be compatible with a Universal Serial Bus (USB) memory, a Secure Digital (SD) card, a mini Secure Digital (mSD) card, a micro SD card, a high-capacity Secure Digital High Capacity (SDHC), a memory stick card, a Smart Media (SM) card, a Multi Media Card (MMC), an Embedded MMC (eMMC), and a Compact Flash (CF) card.

The memory system 1400 according to the embodiment may further include a buffer memory 1440 configured to efficiently perform the data input/output (I/O) operation between the interface 1430 and the memory 1410. The buffer memory 1440 for temporarily storing data may include the above-mentioned semiconductor device. The buffer memory 1440 may include a semiconductor substrate including a trench, a gate insulation film located at the bottom and sidewall of the trench, a junction region formed over the semiconductor substrate, a gate formed over the gate insulation film in a manner such that the gate is buried in the trench, and a multi-layered structure located between the gate and the junction.

As described above, since the multi-layered structure is formed between a gate and a junction region, positive charges are present in the multi-layered structure to capture or offset negative charges existing at an interface between the gate insulation film 120 and the substrate 100 or at an interface between the second nitride film pattern 145 and the insulation film pattern 155 that may cause GIDL. Thus, GIDL is mitigated and pause refresh characteristics are improved, resulting in improvement of semiconductor device characteristics. As a result, the operation characteristics of the memory system 1400 including the buffer memory 1440 can be improved, resulting in the implementation of a high-performance memory system 1400.

In addition, the buffer memory 1440 according to the embodiment may further include a volatile Static Random Access Memory (SRAM), a Dynamic Random Access Memory (DRAM), a non-volatile Phase Change Random Access Memory (PRAM), a Resistive Random Access Memory (RRAM), a Spin Transfer Torque Random Access Memory (STTRAM), a Magnetic Random Access Memory (MRAM), etc.

As is apparent from the above description, since a multi-layered structure is formed between a gate and a junction region, positive charges are present in the multi-layered structure, so that GIDL is mitigated and pause refresh characteristics are improved, resulting in improvement of semiconductor device characteristics.

The above embodiments are only examples and are not intended to limit the inventive concept. Therefore, the embodiments are not limited by the type of deposition, etching, polishing, and patterning steps described herein. Nor are the embodiments limited to any specific type of semiconductor device. For example, embodiments may be implemented in a dynamic random access memory (DRAM) device or non-volatile memory device.

What is claimed is:

1. A semiconductor device comprising:
   a semiconductor substrate including a trench;
   a gate insulation film located over a bottom and sidewall of the trench;
   a first gate formed over the gate insulation film and in a lower portion of the trench;
   a second gate formed over the first gate and in an upper portion of the trench, wherein the first gate is electrically connected to the second gate; and
   a multi-layered structure including a nitride film and an oxide film provided between the gate insulation film and the second gate, wherein an interface layer between the nitride film pattern and the insulation film pattern includes a plurality of positive charges.

2. The semiconductor device according to claim 1, further comprising: a junction region formed in the semiconductor substrate adjacent to the trench.

3. The semiconductor device according to claim 2, wherein the multi-layered structure is overlapped with the junction region.

4. The semiconductor device according to claim 1, wherein the multi-layered structure includes a bi-layer structure of the nitride film and the oxide film.

5. The semiconductor device according to claim 1, wherein the multi-layered structure includes a plurality of nitride films and a plurality of oxide films which are alternately repeated.

6. A semiconductor device comprising:
   a semiconductor substrate including a trench;
   a gate insulation film located over a bottom and sidewall of the trench;
   a junction region formed in the semiconductor substrate adjacent to the trench;
   a gate formed over the gate insulation film and in the trench; and
   a multi-layered structure including a nitride film and an oxide film formed between the gate insulation film and the gate, wherein the multi-layered structure is overlapped with the junction region, wherein an interface between the nitride film pattern and the insulation film pattern includes a plurality of positive charges.

7. The semiconductor device according to claim 6, wherein the multi-layered structure includes a bi-layer structure of a nitride film and an oxide film.

8. The semiconductor device according to claim 6, wherein the multi-layered structure includes a plurality of nitride films and a plurality of oxide films which are alternately repeated.

9. A semiconductor device comprising:
   a gate;
   a junction; and
   a multi-layered structure provided between the gate and the junction, wherein the multi-layered structure includes a stack of an oxide film and a nitride film, and wherein an interface between the oxide film and the nitride film including a positive charge,
   wherein the multi-layered structure is overlapped with the junction.

10. The semiconductor device of claim 9, wherein the nitride film is a nitrogen-excessive nitride film.

11. The semiconductor device of claim 9, wherein the gate is a buried gate including a first gate and a second gate, wherein the second gate is formed over the first gate, and wherein the multi-layered structure overlapped with the junction.

* * * * *